United States Patent

Shimada et al.

(12)

(10) Patent No.: US 6,826,916 B2
(45) Date of Patent: Dec. 7, 2004

(54) LASER MODULE, PELTIER MODULE, AND PELTIER MODULE INTEGRATED HEAT SPREADER

(75) Inventors: Mamoru Shimada, Tokyo (JP); Naoki Kimura, Tokyo (JP); Hajime Noda, Tokyo (JP); Yoshio Nakamura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/125,299

(22) Filed: Apr. 16, 2002

(65) Prior Publication Data

US 2002/0162338 A1 Nov. 7, 2002

(30) Foreign Application Priority Data

Apr. 24, 2001 (JP) ........................................ 2001-126218

(51) Int. Cl.[7] ................................................ F25B 21/02
(52) U.S. Cl. ............................ 62/3.2; 62/3.7; 62/259.2
(58) Field of Search ............................ 62/3.2, 3.6, 3.7, 62/259.2

(56) References Cited

U.S. PATENT DOCUMENTS

| | | | | |
|---|---|---|---|---|
| 3,601,887 A | * | 8/1971 | Mitchell | 29/573 |
| 3,671,404 A | * | 6/1972 | Mecker | 202/176 |
| 3,801,284 A | * | 4/1974 | Meckler | 23/263 |
| 4,091,138 A | * | 5/1978 | Takagi et al. | 428/209 |
| 5,381,434 A | * | 1/1995 | Bhat et al. | 372/45 |
| 5,411,600 A | * | 5/1995 | Rimai et al. | 136/225 |
| 5,864,087 A | * | 1/1999 | Amano et al. | 136/225 |
| 6,084,172 A | * | 7/2000 | Kishi et al. | 136/200 |
| 6,185,941 B1 | * | 2/2001 | Watanabe et al. | 62/3.7 |
| 6,226,994 B1 | * | 5/2001 | Yamada et al. | 62/3.7 |
| 6,256,996 B1 | * | 7/2001 | Ghoshal | 62/3.7 |
| 6,334,311 B1 | * | 1/2002 | Kim et al. | 62/3.2 |
| 6,347,521 B1 | * | 2/2002 | Kadotani et al. | 62/3.7 |
| 2002/0063327 A1 | * | 5/2002 | Chu et al. | 257/706 |

* cited by examiner

*Primary Examiner*—Marc Norman
(74) *Attorney, Agent, or Firm*—Oblon, Spivak, McClelland, Maier & Neustadt, P.C.

(57) ABSTRACT

A Peltier module comprising: thermoelectric elements in which plural p-type and n-type thermoelectric elements are alternately arranged, metal electrodes placed in both ends of the thermoelectric elements in order to connect the thermoelectric elements in series, and metal substrates on at least a part of which surfaces an insulating thin film is formed, the metal substrates being oppositely placed so as to be connected to the metal electrodes and sandwich the metal electrodes and the thermoelectric elements.

14 Claims, 5 Drawing Sheets

LASER MODULE, PELTIER MODULE, AND PELTIER MODULE INTEGRATED HEAT SPREADER

FIELD OF THE INVENTION

The present invention relates to a Peltier module which is an electronic temperature controller used for maintaining constant a temperature of a semiconductor laser chip and an optical system, a Peltier module integrated heat spreader, and a laser module including the Peltier module as a temperature controller.

RELATED ART

In general, laser diode modules have been used as a signal light source of optical fiber communication, particularly trunk line system and CATV or a pump light source of a fiber amplifier. In such laser diode modules, in order to implement high output and stable operation, a Peltier module is incorporated and optical parts such as a laser diode chip, a photodiode chip or a lens and electrical parts such as a thermistor element, an inductor or a resistor are placed on a substrate which is arranged on the Peltier module.

In general, when two kinds of conductors A, B are connected and a current is passed thereto under the condition of a constant temperature, heat generation or heat absorption occurs in a point of contact between the conductors A and B. This is called a Peltier effect. A Peltier module uses this principle. A conventional Peltier module is shown in FIG. 4. As shown in FIG. 4, a p-type semiconductor element 101 and an n-type semiconductor element 102 which are thermoelectric elements are alternately arranged in parallel and electrodes 103, 104 are placed in both ends of respective semiconductor elements. Both ends of respective semiconductor elements are joined to the electrodes by solder. The p-type semiconductor element 101 and the n-type semiconductor element 102 are joined in series electrically through the electrodes alternately.

Further, in order to electrically insulate an electric circuit formed by the electrodes 103, 104, the p-type semiconductor element 101 and the n-type semiconductor element 102 which are the thermoelectric elements from the outside, a pair of electrical insulating substrates 105, 106 are provided in the respective outsides (namely, upper and lower sides in the figure) of the electrodes 103, 104, and the electrodes are joined to the electrical insulating substrates by solder. Thus, the Peltier module has a structure in which the electric circuit formed by the electrodes, the p-type semiconductor element and the n-type semiconductor element is sandwiched by two electrical insulating substrates. As the electrical insulating substrates described above, ceramics are commonly used. According to the Peltier module described above, the heat is moved from the electrical insulating substrate 105 to the electrical insulating substrate 106, thus the electrical insulating substrate 105 is cooled.

In a laser diode module, it is important to cause a semiconductor laser chip to stably oscillate which is a light source, and further prevent deterioration of performance due to a heat. For this purpose, the semiconductor laser chip is connected to the Peltier module through a mount so as to keep constant a temperature of the semiconductor laser chip. In particular, in a pump laser used for signal amplification as a part of an optical fiber communication system, accurate temperature control is required since stability of the wavelength and output thereof is required.

In a pump laser used for an optical signal amplifier, alumina ($Al_2O_3$) which is ceramic material is commonly used in a substrate of the Peltier module (a metal plating layer or a metal thin film layer is formed in advance on this ceramic substrate). A lower substrate of the Peltier module and a bottom plate of the laser module are joined by solder and further, an upper substrate of the Peltier module and a semiconductor laser mount is also joined by solder.

Since the alumina ($Al_2O_3$) used as an insulating substrate of the Peltier module has small thermal conductivity, the heat which is conducted from the semiconductor laser chip to the alumina substrate through the mount is not sufficiently conducted to the periphery of the substrate. As a result, the temperature is high in the central portion of the alumina substrate whereas the temperature is low in the end portion of the alumina substrate, thus the temperature of the substrate is not uniform.

When the Peltier module is driven under the condition in which the temperature of the substrate is not uniform, the heat is transferred in the central portion of the Peltier module, however the amount of the heat transfer becomes small in the edge portion of the Peltier module. As a result, there is a problem in which the amount of the transferred heat in the Peltier module as a whole becomes small and the transferred heat corresponding to driving power of the Peltier module, namely heat transfer efficiency, is lowered. Therefore, a larger current energy is consumed to transfer the heat generated from the semiconductor laser chip.

In order to solve the above-mentioned problem, there is also proposed a technique for reducing temperature differences in the substrate of a Peltier module by bringing the whole surface of the substrate of the Peltier module into contact with the laser diode chip mount in which a shape of the bottom of the mount is formed into the same shape as those of the substrate of the Peltier module or the size of the bottom of the mount is formed to be larger than the size of the substrate of the Peltier module.

However, in case that warp deformation (i.e, bending) occurs in the substrate of the Peltier module due to heating and cooling, the warp deformation extends to a plate of the mount, and a risk of causing a critical defect in which a deviation (i.e., misalignment) occurs in an optical system comprising a semiconductor laser, a lens and an optical fiber becomes larger. Since the optical system of such a laser module is adjusted very accurately, an output of the laser module is remarkably reduced even in case that the misalignment slightly occurs in the optical system.

Further, when alumina ($Al_2O_3$) with small thermal conductivity is used as an insulating substrate of the Peltier module, a temperature gradient in a depth direction (that is, plate thickness direction) of the substrate becomes large and as a result, a temperature difference becomes large between the joint portion of a high temperature side and the joint portion of a low temperature side of a thermoelectric element (circuit) at the time of driving the Peltier module. In order to transfer a constant amount of heat in a state in which the temperature difference is large between the joint portion of the high temperature side and the joint portion of the low temperature side of the thermoelectric element (circuit), thus, electric power necessary to drive the Peltier module becomes larger and as a result, a problem occurs that the amount of heat transfer with respect to driving power of the Peltier module, namely heat transfer efficiency, is lowered.

Further, it is also proposed that aluminum nitride (AlN) with high thermal conductivity be used as the insulating substrate of the Peltier module. The conventional problem that the heat transfer efficiency is lowered when the alumina ($Al_2O_3$) is used in the substrate of the Peltier module can be solved by using the aluminum nitride (AlN) in the substrate of the Peltier module.

However, the aluminum nitride (AlN) differs in a thermal expansion coefficient from CuW used for a base plate (that is, case bottom plate) as well as a mount of a laser module. In addition, the insulating substrate of the Peltier module differs in the amount of expansion or shrinkage from the case bottom plate or the mount in the case of expansion or shrinkage by heating or cooling at the time of driving the laser module. As a result, there is a problem that thermal stress applied to a joint solder face becomes large.

Therefore, when the thermal stress is repeatedly applied to a solder joint face, there is a problem that creep or peeling occurs on the joint face. Further, since the aluminum nitride (AlN) has properties that mechanical strength is weaker as compared with the alumina ($Al_2O_3$), there is a problem in which a risk of the damage in the insulating substrate itself of the Peltier module increases more when expansion or shrinkage occurs in the insulating substrate of the Peltier module by heating or cooling at the time of driving the laser module.

Further, in the laser module, higher output and smaller power consumption have been required. Thus, it is also necessary to reduce power consumption itself of the Peltier module.

Therefore, it is desired to provide a Peltier module and a laser module in which a large variations in temperature do not occur in the central portion and the end portion of the substrate of the Peltier module, thus the heat transfer efficiency is not lowered and the substrate of the Peltier module is not damaged and power consumption is small and reliability is high.

SUMMARY OF THE INVENTION

One embodiment of a Peltier module of the invention is a Peltier module comprising thermoelectric elements in which plural p-type and n-type thermoelectric elements are alternately arranged, metal electrodes placed in both ends of the thermoelectric elements in order to connect the thermoelectric elements in series, and metal substrates on at least a part of which surfaces an insulating thin film is formed, the metal substrates being oppositely placed so as to be connected to the metal electrodes and sandwich the metal electrodes and the thermoelectric elements.

One embodiment of a laser module of the invention is a laser module comprising (1) a laser diode (LD) element, (2) a photo coupling member for coupling laser light from the LD element to an optical fiber, and (3) a temperature control member for stabilizing an oscillation state of the LD element, the temperature control member including a Peltier module comprising thermoelectric elements in which plural p-type and n-type thermoelectric elements are alternately arranged, metal electrodes placed in both ends of the thermoelectric elements in order to connect the thermoelectric elements in series, and metal substrates on at least a part of which surfaces an insulating thin film is formed, the metal substrates being oppositely placed so as to be connected to the metal electrodes and sandwich the metal electrodes and the thermoelectric elements.

One embodiment of a Peltier module integrated heat spreader of the invention is a Peltier module integrated heat spreader including a Peltier module comprising thermoelectric elements in which plural p-type and n-type thermoelectric elements are alternately arranged, metal electrodes placed in both ends of the thermoelectric elements in order to connect the thermoelectric elements in series, and two metal substrates on at least a part of which surfaces an insulating thin film is formed, the metal substrates being oppositely placed so as to be connected to the metal electrodes and sandwich the metal electrodes and the thermoelectric elements, wherein one of two metal substrates is connected to a heat generating element and the remaining metal substrate is extended to form a leg portion, said leg portion covering the heat generating element mounted on an electronic board.

DETAILED DESCRIPTION

A Peltier module and a laser module of the invention will be described in detail with reference to the drawings.

One object of the invention is to provide a Peltier module, a Peltier module integrated heat spreader and a laser module in which a large difference in temperature do not occur between the center portion and the end portion of a substrate of the Peltier module, thus the heat transfer efficiency is not lowered, the substrate of the Peltier module is not damaged, power consumption therein is small, and reliability thereof is high.

The present inventors have intensively studied in order to solve the conventional problems described above. As a result, it was found to enable to provide a Peltier module and a laser module having its Peltier module in which a substrate is not damaged and power consumption is small and heat transfer efficiency is excellent and reliability is high by using a metal substrate with high thermal conductivity and a small thermal expansion coefficient in a substrate of the Peltier module and forming an insulating thin film by a particular method on a surface of the metal substrate which is joined to a metal electrode.

Further, it was found that heat of a CPU with a large heat generation can be dissipated efficiently by using as a heat spreader a Peltier module integrated heat spreader in which the above-mentioned Peltier module is integrated between a CPU and a heat spreader.

A Peltier module of the invention is a Peltier module comprising thermoelectric elements in which plural p-type and n-type thermoelectric elements are alternately arranged, metal electrodes placed in both ends of the thermoelectric elements in order to connect the thermoelectric elements in series, and metal substrates on at least a part of which surfaces an insulating thin film is formed, the metal substrates being oppositely placed so as to be connected to the metal electrodes and sandwich the metal electrodes and the thermoelectric elements.

Figure 1:
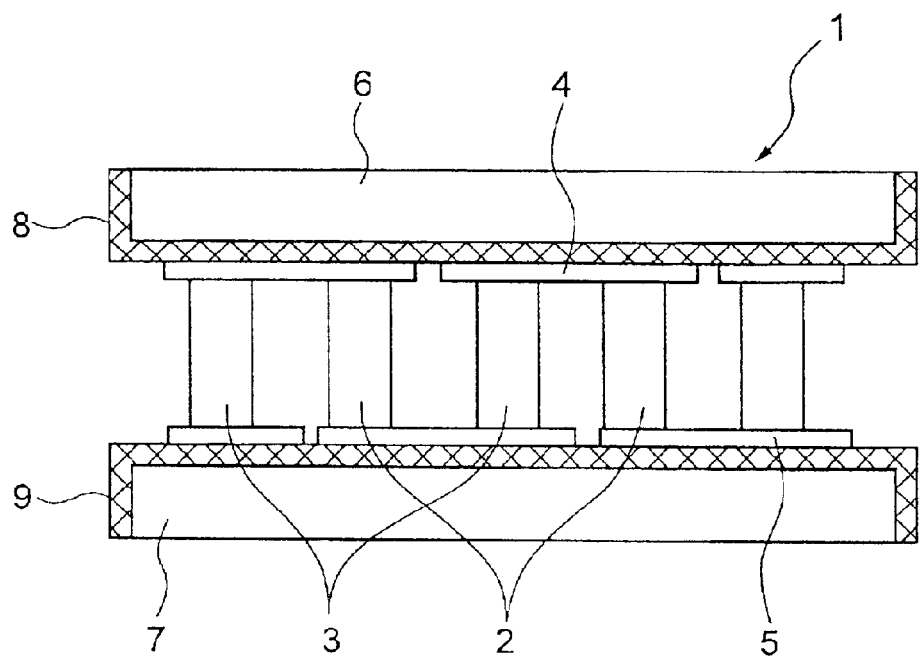
FIG. 1 is a schematic sectional view of a Peltier module of the invention.

FIG. 1 is a schematic side sectional view of a Peltier module of the invention. As shown in FIG. 1, a p-type semiconductor element 2 and an n-type semiconductor element 3 which are thermoelectric elements are alternately arranged in parallel and electrodes 4, 5 are connected and placed to both ends of each of the semiconductor element. Both ends of each of the semiconductor element are joined to the electrodes by solder. The p-type semiconductor element 2 and the n-type semiconductor element 3 form a series circuit through the electrodes.

Further, in order to electrically insulate an electric circuit formed by the electrodes 4, 5, the p-type semiconductor element 2 and the n-type semiconductor element 3 which are the thermoelectric elements, metal substrates 6, 7 on which surfaces insulating thin films 8, 9 are formed are arranged on outer side of the electrodes 4, 5, which side is opposite to the semiconductor elements 2, 3. The electrodes are joined by solder to the surfaces of the metal substrates on which surfaces the insulating thin films are formed. Thus, the Peltier module of the invention has a structure in which the electric circuit formed by the electrodes, the p-type semiconductor element and the n-type semiconductor element is interposed in a sandwich manner by the two metal substrates on which surfaces the insulating thin films are formed.

Further, the insulating thin film described above is formed on the surface of the respective metal substrates, which is joined to the metal electrode. Furthermore, the insulating thin film described above is formed on the surface of the respective metal substrates by high-frequency pump type ion plating.

As the insulating thin film, a ceramic thin film can be used and, for example, there are thin films of $SiO_2$, $Al_2O_3$, AlN, MgO or the like. Further, thin films of non-conductive organic material may be used as the insulating thin film.

The above-mentioned metal substrate in the Peltier module of the invention is made of any one of copper, copper alloy, aluminum, aluminum alloy, molybdenum, molybdenum alloy, tungsten, tungsten alloy, titanium, titanium alloy, nickel, nickel alloy, silver and silver alloy. The tungsten alloy (cuW) has high thermal conductivity, so that power consumption of the Peltier module can be more reduced and further, the power consumption of the laser diode module as a whole can be reduced. When the molybdenum alloy is used, the thermal expansion thereof is small, so that the deformation of the substrate becomes small when driving the Peltier module, thus favorable. Also, when the copper is used, the thermal conductivity thereof is larger, so that the heat transfer efficiency of the Peltier module can be further improved.

The metal substrate is preferably made of metal having excellent thermal conductivity and a linear expansion coefficient within a prescribed range (6.5 to $8.3^{-6}$/K). Further, a thickness of the above-mentioned metal substrate is at least 10 $\mu$m and a thickness of the insulating thin film is preferably within the range of from 10 nm to 100 $\mu$m.

Figure 3:
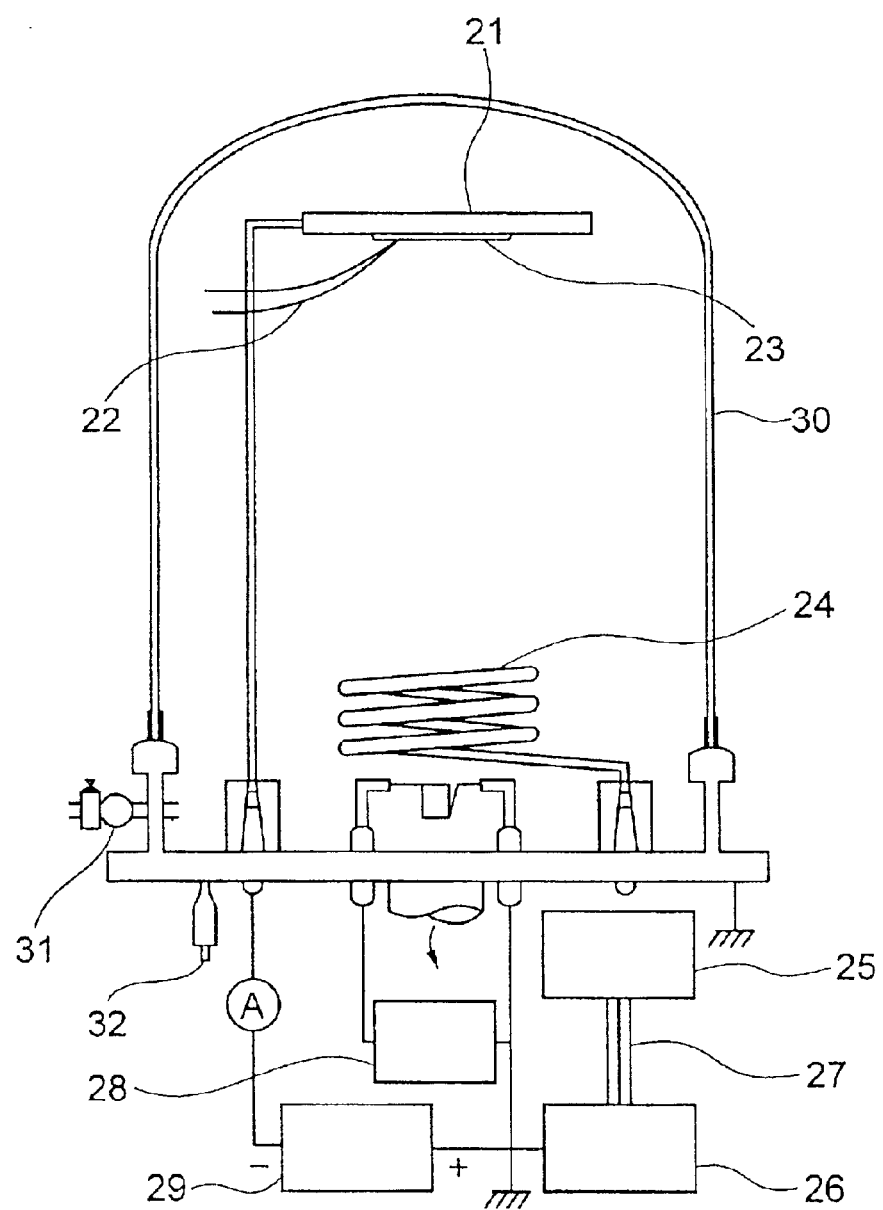
FIG. 3 is a schematic side sectional view of one example of a method for forming an insulating thin film on a surface of a metal substrate by high-frequency pump type ion plating.

FIG. 3 is a schematic side sectional view of one example of a method for forming an insulating thin film on a surface of the metal substrate by high-frequency pump type ion plating. As shown in FIG. 3, the substrate 23 is attached to a substrate support table 21 acting as a cathode installed within a vacuum chamber 30. A thermocouple 22 is connected to the substrate. An RF coil 24 is installed in the lower portion of the vacuum chamber 30. A DC power source 29 for acceleration for charging the substrate support table 21 to a negative electric, a high-frequency power source 26 connected to the DC power source for acceleration and a matching box 25 connected to the high-frequency power source through a coaxial cable 27 are placed in the outside of the vacuum chamber 30. Further, a power source 28 for evaporation is placed.

In a method for forming an insulating thin film on a surface of the metal substrate described above, particles of $SiO_2$, $Al_2O_3$, MgO, etc. are evaporated in the vacuum chamber 30 and the evaporated particles are ionized using a high-frequency electric field. That is, the evaporated particles (atoms) are ionized and acceleratingly collided with the negatively charged substrate to form a dense thin film with strong adhesion.

The thin film formed in this manner is a film formed by atom deposition in a vacuum with no impurity, so that the thin film is dense and smooth and a change with time is small. Further, as described above, the ionized particles having kinetic energy are collided with the negatively charged substrate, so that the adhesion to the substrate is strong. Furthermore, the substrate is treated at a relatively low temperature, so that a rise in temperature of the substrate is small and there is no need to consider the affection of the annealing phenomenon of the raw material.

In the present invention, as described above, by using a metal having high thermal conductivity instead of using the conventional ceramics in the substrate of the Peltier module, a function acting as a heat spreader is provided in the substrate per se. By additionally providing the function acting as the heat spreader in the substrate thus, a temperature gradient in the surface of the substrate becomes small. Small temperature gradient in the substrate surface of the Peltier module causes the heat to be transferred uniformly in the whole surface of the Peltier module.

Therefore, the amount of heat transfer with respect to the amount of power consumption in the Peltier module, namely the heat transfer efficiency can be further improved, and the efficiency of the Peltier module per se can be improved. It is requested that power consumption of the Peltier module should be further reduced in an environment in which the Peltier module is used, and according to the invention, a Peltier module with small power consumption and high heat transfer efficiency can be provided.

Figure 2:
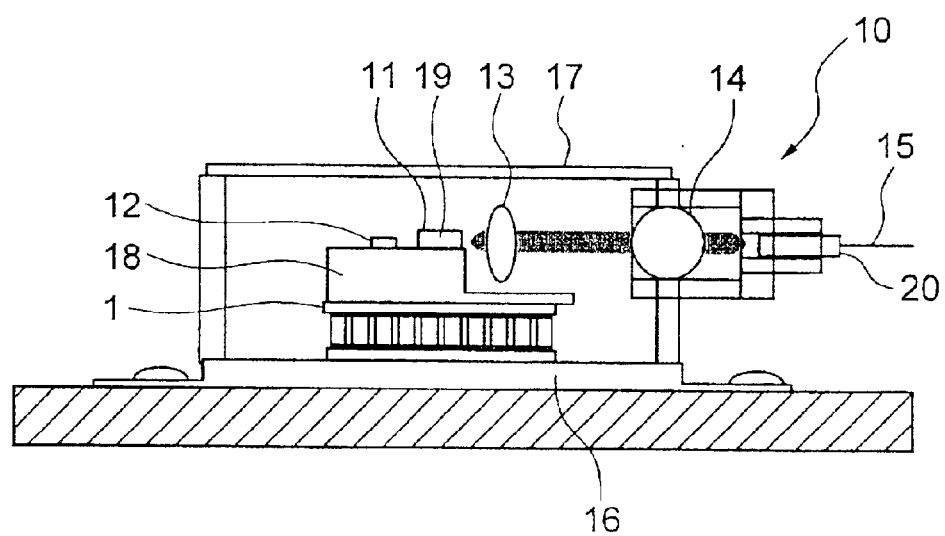
FIG. 2 is a schematic side sectional view of a laser module of the invention.

Then, a laser module of the invention will be described. FIG. 2 is a schematic side sectional view of a laser module of the invention. The laser module of the invention is, for example, an LD module for pumping optical amplifier. The LD module for pumping comprises an LD element, a photo coupling portion for coupling laser light from the LD element to an optical fiber, and a temperature control portion for stabilizing an oscillation state of the LD element.

That is, a laser module of the invention is a laser module comprising (1) a laser diode (LD) element, (2) a photo coupling member for coupling laser light from the LD element to an optical fiber, and (3) a temperature control member for stabilizing an oscillation state of the LD element. The temperature control member includes a Peltier module comprising thermoelectric elements in which plural p-type and n-type thermoelectric elements are alternately arranged, metal electrodes placed in both ends of the thermoelectric elements in order to connect the thermoelectric elements in series, and metal substrates on at least a part of which surfaces an insulating thin film is formed. The metal substrates are oppositely placed so as to be connected to the metal electrodes and sandwich the metal electrodes and the thermoelectric elements.

Features of the Peltier module in the laser module are as described above.

As shown in FIG. 2, a laser module 10 comprises an LD element 11, a first lens 13, a second lens 14, a core expanded fiber 15 and a hermetically sealed case 17. The LD element 11 is mounted on a base 18 through a chip carrier 19 at a prescribed spacing with respect to the first lens 13. The base 18 is placed on a Peltier module 1 for temperature control which is provided within the hermetically sealed case 17.

In the first lens 13, a collimator lens is held in a lens holder (not shown). The lens holder is welded and fixed in the base 18. In the collimator lens, an aspherical lens is used in order to obtain high coupling efficiency. In the second lens 14, a spherical lens in which upper and lower portions are cut off is held in a lens holder. A position of the lens holder is adjusted in a plane perpendicular to an optical axis and the lens holder is fixed in an insertion cylinder of the hermetically sealed case 17.

In the core expanded fiber 15, the top side of the expanded core is slantingly polished at an angle of inclination of about 6° with respect to the optical axis and also an antireflective coating is applied to a polished surface, and the top side is bonded into a metal tube 20 and is protected. The metal tube 20 is welded so as to be fixed in the optimum position of an adjusting member (not shown). The metal tube 20 is adjusted in the optimum position of the adjusting member by sliding the metal tube 20 backward and forward along an optical axis direction of the core expanded fiber 15 within the adjusting member or rotating the metal tube 20 about the optical axis.

In Particular, when the Peltier module according to the present invention is used for cooling the semiconductor laser chip (LD element) of the laser module as described above, heat from a compact semiconductor laser chip or a mount thereof can be sufficiently and uniformly diffused within the substrate of the Peltier module, so that the Peltier module can effectively transfer the heat, and the power consumption of the Peltier module can be lowered as compared with the conventional art. As a result, the power consumption can be lowered in the laser module as a whole.

Further, in the Peltier module according to the present invention, by providing a function acting as a heat spreader in a metal substrate of the Peltier module, a temperature difference in a depth direction (that is, plate thickness direction) within the substrate becomes small. Furthermore, a thin film formed on a surface of the metal substrate is used as an electrical insulating layer, so that thermal resistance in the electrical insulating layer having small thermal conductivity can be sufficiently reduced and the temperature difference in the depth direction within the substrate becomes small.

By means of reducing the temperature difference in the depth direction within the substrate in this manner, even when a temperature difference between a heat absorbing portion and a heat dissipating portion of a thermoelectric element circuit is equal to that of the conventional Peltier module, a temperature difference between the upper end portion of the upper substrate and the lower end portion of the lower substrate of the Peltier module can be made larger as compared with the conventional Peltier module using ceramics in the substrate. As a result, heat transfer efficiency can be further improved.

Further, when the Peltier module according to the present invention is used in the laser module, a temperature difference between the semiconductor laser chip and the heat sink can be made larger. Accordingly, even in a severe environment with a high outside-air temperature and a high temperature of the heat sink, a temperature of the semiconductor laser chip can stably be held constant and as a result, output of the laser module can be stabilized.

Further, in the Peltier module of the present invention, thermal diffusion in the substrate along the surface direction is performed sufficiently to diffuse the heat from the center portion to the periphery portion of the substrate, so that the heat transfer can be performed uniformly in the whole surface (that is, from the whole surface of the upper substrate to the whole surface of the lower substrate) of the Peltier module as compared with the conventional art even when a large size of Peltier module is manufactured. As a result, when a Peltier module with the amount of heat transfer larger than that of the conventional art is used in the laser module, the temperature of a semiconductor laser chip with larger output can be effectively controlled, and a laser module with large output and higher stability can be manufactured.

In the Peltier module of the present invention, a metal with higher elasticity as compared with the conventional ceramics is used as the substrate, so that even when stress is produced in the substrate due to heating and cooling of the substrate or thermoelectric material, a risk of causing cracks or damage in the Peltier module becomes small. In addition, when the Peltier module of the present invention is used in the laser module, reliability of the laser module can be remarkably improved.

Also, in the Peltier module of the invention, an insulating thin film formed on the surface of the metal substrate by high-frequency pump type ion plating, as described above, is used as an insulating layer. Therefore, even when stress is produced in the substrate by a difference in a linear expansion coefficient between a metal of the substrate body and the insulating layer due to heating or cooling at the time of driving the Peltier module, there is no danger that the insulating layer is damaged, since the insulating thin film in the present invention is close (i.e.,dense) and sufficiently thin and has strong adhesion.

Further, in the Peltier module of the present invention, a metal with higher elasticity as compared with the conventional ceramics is used as the substrate, so that the substrate can be thin while maintaining mechanical strength of the substrate. In addition, when the substrate is made thin, the substrate sufficiently performs a function acting as a heat spreader, so that the heat transfer efficiency of the Peltier module is not lowered.

Further, in the case of a ceramic insulating substrate used in the conventional Peltier module, the insulating substrate needs to apply metal plating to the outer surface of the ceramic substrate so that the insulating substrate can be joined to the bottom plate of the laser module and the mount of the semiconductor laser by solder, but in the Peltier module of the present invention, since a metal is used in the substrate, the joining by solder is easy and there is no need to perform complicated surface treatment such as plating treatment.

When CuW is used in the substrate of the Peltier module, as well as the mount and the case bottom plate which are joined by solder, a thermal expansion coefficient of the substrate of the Peltier module is equal to that of the mount and the case bottom plate, so that a risk of the damage of the solder joint portions in the respective interfaces becomes small, even when the laser module is driven and each portion expands or shrinks due to heating or cooling.

Further, a Peltier module integrated heat spreader of the invention is a Peltier module integrated heat spreader including a Peltier module comprising thermoelectric elements in which plural p-type and n-type thermoelectric elements are alternately arranged, metal electrodes placed in both ends of the thermoelectric elements in order to connect the thermoelectric elements in series, and two metal substrates on at least a part of which surfaces an insulating thin film is formed, the metal substrates being oppositely placed so as to be connected to the metal electrodes and sandwich the metal electrodes and the thermoelectric elements, wherein one of the two metal substrates is connected to a heat generating element and the remaining metal substrate is extended to form a leg portion, said leg portion covering the heat generating element mounted on an electronic board.

Figure 4:
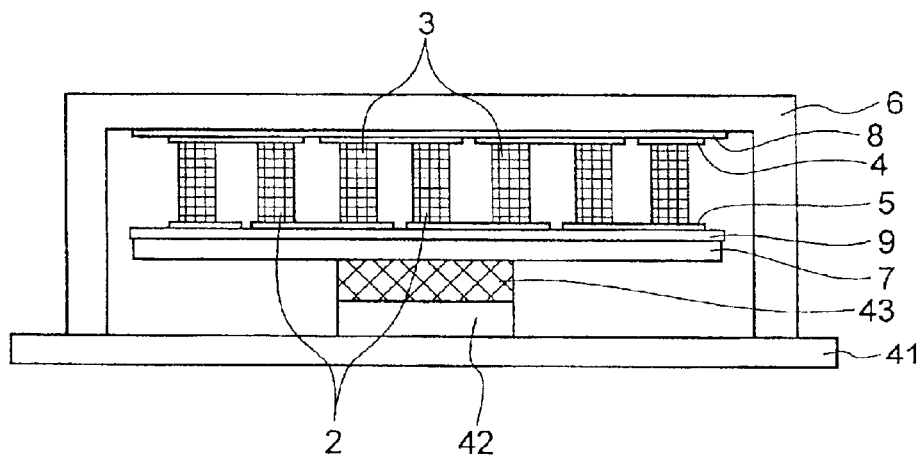
FIG. 4 is a schematic side sectional view of one embodiment of a Peltier module integrated heat spreader of the invention.

FIG. 4 is a schematic side sectional view of one embodiment of a Peltier module integrated heat spreader of the invention. As shown in FIG. 4, metal electrodes 4, 5 for serially connecting thermoelectric elements in which plural p-type thermoelectric elements 2 and n-type thermoelectric elements 3 are alternately arranged are placed in both ends of the thermoelectric elements. Further, two metal substrates 6, 7 on which surfaces insulating thin films 8, 9 are formed are oppositely placed so as to be connected to the above-mentioned metal electrodes 4, 5 and sandwich the metal electrodes 4, 5 and the thermoelectric elements 2, 3.

A heat generating element (CPU) 42 is mounted on a circuit board 41 and is thermally connected to the metal substrate 7 through an adhesive agent (for example, epoxy adhesive agent agent) 43. In the metal substrate 6, the end portions of the metal substrate are extended (for example, downward) to form a leg portion and the leg portion covers the heat generating element 42 mounted on the electronic (circuit) board 41. By arranging the heat generating element and a Peltier element so as to be placed between the heat spreader with the leg portion extended and the circuit board in this manner, thermal connection can be further ensured.

Figure 7:
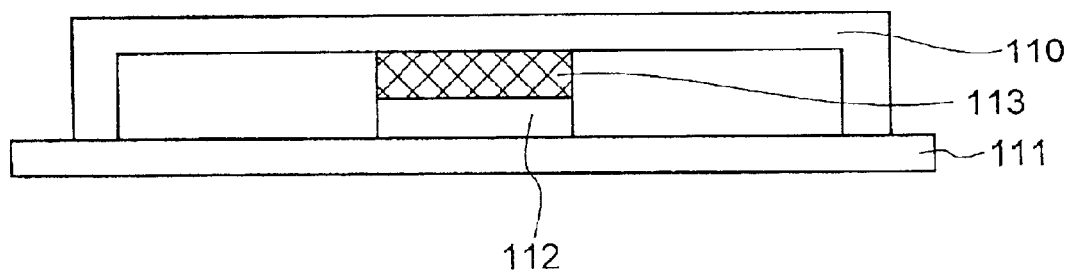
FIG. 7 is a schematic side sectional view of a conventional heat spreader.

An epoxy adhesive agent is used in joining between the CPU and the Peltier module, and the Peltier module and the heat spreader are joined by solder. In this case, heat is absorbed from the Peltier substrate (that is, metal substrate 7) in contact with the CPU through the epoxy adhesive agent to make large the temperature difference between the Peltier substrate and the CPU. When the temperature difference becomes large, heat can be sufficiently conducted even through the epoxy adhesive agent having low thermal conductivity. Therefore, a temperature of the CPU can be sufficiently lowered. On the contrary, a conventional heat spreader shown in FIG. 7 is made of copper and a CPU 112 is strongly coupled to a heat spreader 110 by an epoxy adhesive 113, but thermal conductivity of the epoxy adhesive is as small as 1 W/m·° C. and thermal resistance is large, so that the temperature of the CPU cannot be sufficiently lowered.

Further, in the Peltier module integrated heat spreader of the invention, the end portion of the whole circumference of the above-mentioned metal substrate may be extended to form a leg portion and the leg portion may fully cover the heat generating element mounted on the electronic board. Furthermore, the end portion of the above-mentioned metal substrate is partially extended to form a leg portion and the leg portion may partially cover the heat generating element mounted on the electronic board.

By covering the CPU (heat generating element) with the metal substrate in this manner, the CPU can be prevented from mechanically making contact with other members to be broken at the time of assembly of a personal computer etc. and also, a function of protecting the CPU from electromagnetic waves generated from other electronic parts can be provided. That is, since there is a cap-shaped heat spreader by which the heat generating element and the Peltier module are surrounded in all directions, comings and goings of electromagnetic noise can be prevented and EMI measures to an ambience can be expected. Further, since a surface area becomes large, a heat dissipating effect improves.

Figure 5:
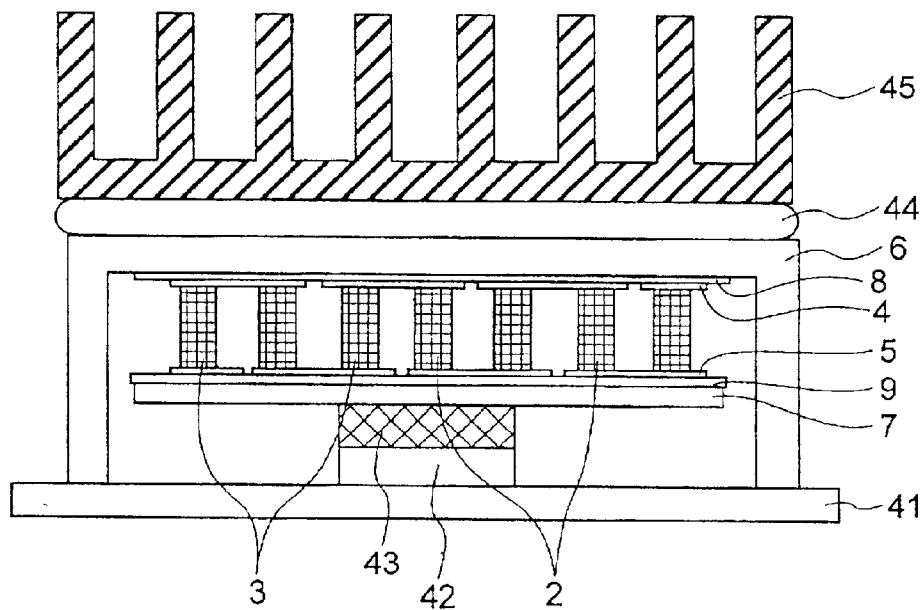
FIG. 5 is a schematic side sectional view of another embodiment of a Peltier module integrated heat spreader of the invention.
Figure 6:
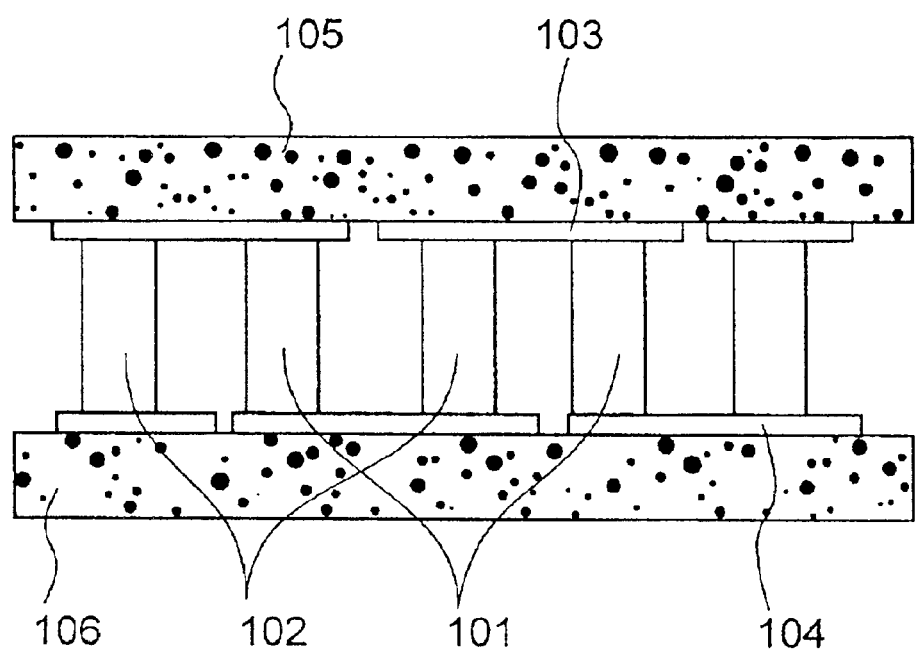
FIG. 6 is a schematic side sectional view of a conventional Peltier module.

FIG. 5 is a schematic side sectional view of another embodiment of a Peltier module integrated heat spreader of the invention. In this embodiment, metal electrodes 4, 5 for serially connecting thermoelectric elements in which plural p-type thermoelectric elements 2 and n-type thermoelectric elements 3 are alternately arranged are placed in both ends of the thermoelectric elements. Further, two metal substrates 6, 7 in which insulating thin films 8, 9 are formed on the surfaces are oppositely placed so as to be connected to the above-mentioned metal electrodes 4, 5 and sandwich the metal electrodes 4, 5 and the thermoelectric elements 2, 3. A heat generating element (CPU) 42 is mounted on a circuit board 41 and is thermally connected to the metal substrate 7 through an adhesive agent (for example, epoxy adhesive agent) 43. The end portion of the metal substrate 6 is extended (for example, downward) to form a leg portion and the end of the leg portion covers the heat generating element 42 mounted on the electronic (circuit) board 41. Further, heat dissipating fins 45 are further provided on the above-mentioned metal substrate 6 through a thermal conductive sheet 44.

As described above, according to the invention, there can be provided a Peltier module, a Peltier module integrated heat spreader and a laser module in which large variations in temperature do not occur in the center portion and the end portion of the substrate of the Peltier module and thus heat transfer efficiency is not lowered and the substrate of the Peltier module is not damaged and power consumption is small and reliability is high.

EXAMPLES

The present invention will be described below in further detail by examples.

Example 1

As shown in FIG. 1, a p-type semiconductor element 2 and an n-type semiconductor element 3 which are thermoelectric elements were alternately placed in parallel, and electrodes made of copper were placed on the respective end portions of the thermoelectric elements, and the respective end portions of the thermoelectric elements were joined to the corresponding electrodes by solder. In this case, the p-type semiconductor element and the n-type semiconductor element form an electrical series circuit through the electrodes.

In order to electrically insulate an electric circuit formed by the thermoelectric elements and the electrodes thus joined from the outside, electrical insulating substrates were placed on the outer sides of the respective electrodes so as to interpose therebetween the thermoelectric elements and the electrodes in a sandwich manner.

As the electrical insulating substrate, a thin film of alumina ($Al_2O_3$) with a thickness of 1.7 μm was formed on a rectangular plate of CuW with 12 mm long by 10 mm wide by 0.3 mm thick by means of vacuum deposition, and a substrate in which electrical insulating thin films were formed on surfaces of the substrate was prepared. The electrical insulating thin films were formed on a total of five surfaces of the six surfaces of the substrate including the surface in contact with the electrode and thermoelectric element circuit and four surfaces adjacent thereto.

The substrate thus prepared was joined to the electrodes by solder to manufacture a Peltier module with 12 mm long by 10 mm wide by 1.6 mm thick of the invention.

The Peltier module of the invention thus manufactured was integrated into a laser module as shown in FIG. 2, and the operating condition thereof was tested.

As a result, it was possible that an LD (an amount of heat generation of the chip per se was about 6 w) was driven under the condition of an oscillation wavelength of 1.48 $\mu$m and output of 400 mW at an ambient temperature of 75° C.

As is evident from the above, according to the invention, a Peltier module with excellent heat transfer efficiency and an LD module for pumping with high output can be obtained.

Example 2

As shown in FIG. 1, a p-type semiconductor element 2 and an n-type semiconductor element 3 which are thermoelectric elements were alternately placed in parallel, and electrodes made of copper were placed on the respective end portions of the thermoelectric elements, and the respective end portions of the thermoelectric elements were joined to the corresponding electrodes by solder. In this case, the p-type semiconductor element and the n-type semiconductor element form an electrical series circuit through the electrodes.

In order to electrically insulate an electric circuit formed by the thermoelectric elements and the electrodes thus joined from the outside, electrical insulating substrates were placed on the outer sides of the respective electrodes so as to interpose therebetween the thermoelectric elements and the electrodes in a sandwich manner.

A thin film of silica ($SiO_2$) with a thickness of 2.0 $\mu$m was formed on a rectangular copper plate with 12 mm long by 10 mm wide by 0.3 mm thick by means of high-frequency pump type ion plating, and an electrical insulating substrate in which electrical insulating thin films were formed on the surfaces was prepared. The electrical insulating thin films were formed on a total of five surfaces of the six surfaces of the copper plate including the surface in contact with the electrode and thermoelectric element circuit and four surfaces adjacent thereto.

The substrate thus prepared was joined to the electrodes by solder to manufacture a Peltier module with 12 mm long by 10 mm wide by 1.6 mm thick of the invention.

The Peltier module of the invention thus manufactured was integrated into a laser module as shown in FIG. 2, and the operating condition thereof was tested.

As a result, it was possible that an LD (an amount of heat generation of the chip per se was about 6 w) was driven under the condition of an oscillation wavelength of 1.48 $\mu$m and output of 400 mW at an ambient temperature of 75° C.

As is evident from the above, according to the invention, a Peltier module with excellent heat transfer efficiency and an LD module for pumping with high output can be obtained.

Example 3

As shown in FIG. 1, a p-type semiconductor element 2 and an n-type semiconductor element 3 which are thermoelectric elements were alternately placed in parallel, and electrodes made of copper were placed on the respective end portions of the thermoelectric elements, and the respective end portions of the thermoelectric elements were joined to the corresponding electrodes by solder. In this case, the p-type semiconductor element and the n-type semiconductor element form an electrical series circuit through the electrodes.

In order to electrically insulate an electric circuit formed by the thermoelectric elements and the electrodes thus joined from the outside, electrical insulating substrates were placed on the outer sides of the respective electrodes so as to interpose therebetween the thermoelectric elements and the electrodes in a sandwich manner.

A thin film of aluminum nitride (AlN) with a thickness of 2.0 $\mu$m was formed on surfaces of a rectangular molybdenum alloy plate with 12 mm long by 10 mm wide by 0.3 mm thick by means of high-frequency pump type ion plating, and an electrical insulating substrate in which electrical insulating thin films were formed on the surfaces was prepared. The electrical insulating thin films were formed on a total of five surfaces of the six surfaces of the molybdenum alloy plate including the surface in contact with an electrode and thermoelectric element circuit and four surfaces adjacent thereto.

The substrate thus prepared was joined to the electrodes by solder to manufacture a Peltier module with 12 mm long by 10 mm wide by 1.6 mm thick of the invention.

The Peltier module of the invention thus manufactured was integrated into a laser module as shown in FIG. 2, and the operating condition thereof was tested.

As a result, it was possible that an LD (an amount of heat generation of the chip per se was about 6 w) was driven under the condition of an oscillation wavelength of 1.48 $\mu$m and output of 400 mW at an ambient temperature of 75° C.

Example 4

As shown in FIG. 4, a p-type semiconductor element 2 and an n-type semiconductor element 3 which are thermoelectric elements were alternately placed in parallel, and electrodes made of copper were placed on the respective end portions of the thermoelectric elements, and the respective end portions of the thermoelectric elements were joined to the corresponding electrodes by solder. In this case, the p-type semiconductor element and the n-type semiconductor element form an electrical series circuit through the electrodes.

In order to electrically insulate an electric circuit formed by the thermoelectric elements and the electrodes thus joined from the outside, electrical insulating substrates were placed on the outer sides of the respective electrodes so as to interpose therebetween the thermoelectric elements and the electrodes in a sandwich manner.

Then, a thin film of silica ($SiO_2$) with a thickness of 2.0 $\mu$m was formed on an inner surface, which is connected to the electrodes, of a copper plate of a heat spreader with 40 mm long by 40 mm wide by 4.0 mm high, and a surface of a rectangular copper plate with 12 mm long by 10 mm wide by 0.3 mm thick by means of high-frequency pump type ion plating, the leg portion of which heat spreader is extended so as to be in a shape covering all sides, to prepare the heat spreader and an electrical insulating substrate in which electrical insulating thin films were formed on the surfaces. That is, the electrical insulating thin films were formed on the surfaces of the copper plates in contact with an electrode and thermoelectric element circuit.

The heat spreader and the electrical insulating substrate thus prepared were joined to the electrodes by solder to manufacture a heat spreader to which a Peltier module with 12 mm long by 10 mm wide by 1.6 mm thick of the invention was joined.

The thus manufactured heat spreader to which the Peltier module of the invention was joined was connected to a CPU mounted on a substrate through an epoxy adhesive agent, and the leg portion of the heat spreader was fixed in the substrate as shown in FIG. 4, and the operating condition thereof was tested.

As a result, under an atmospheric temperature of 45° C., a surface temperature of the CPU could be maintained at 55° C. during the operation.

As is evident from the above, according to the invention, a Peltier module with excellent heat transfer efficiency, a Peltier module integrated heat spreader and an LD module for pumping with high output can be obtained.

Incidentally, as shown in the examples, the insulating thin films may be formed on all the surfaces of a total of five surfaces of the rectangular substrate including the surface in contact with an electrode and thermoelectric element circuit and four surfaces adjacent thereto, or may be formed on only the surface in contact with the thermoelectric element circuit of the substrate.

As described above, in the Peltier module of the present invention, a structure body in which the insulating thin film is formed on the metal plate is used as the insulating substrate for sandwiching the thermoelectric elements and the electrodes, and in addition, a function acting as a heat spreader is provided in the substrate, and the heat spreader is used for temperature control of the semiconductor laser chip in the laser module, so that heat from the semiconductor laser chip and optical components can be sufficiently and speedily diffused within the substrate of the Peltier module and as a result, heat transfer can be performed uniformly in the whole surface of the Peltier module.

Further, since the heat transfer is uniformed performed in the whole surface of the Peltier module, the electric power loss at the time of driving the Peltier module is reduced to achieve a reduction in power consumption as the whole laser diode module. Also, even in the case that an amount of heat generation from the semiconductor chip increases in the future or in an installation condition that environmental temperature is further higher, precise temperature control of the semiconductor chip can be implemented.

As described above, according to the invention, there can be provided a Peltier module, a Peltier module integrated heat spreader and a laser module in which a large variations in temperature do not occur in the center portion and the end portion of the substrate of the Peltier module and thus heat transfer efficiency is not lowered, and the substrate of the Peltier module is not damaged and power consumption is small and reliability is high.

What is claimed is:

1. A Peltier module comprising:
   thermoelectric elements in which plural p-type and n-type thermoelectric elements are alternately arranged;
   metal electrodes placed in both ends of said thermoelectric elements in order to connect said thermoelectric elements in series; and
   metal substrates on at least part of which surfaces an insulating thin film comprising at least one of silica ($SiO_2$), alumina ($Al_2O_3$), aluminum nitride (AlN), and magnesia (MgO) is formed by high-frequency pump type ion plating, said insulating film having a thickness within the range of 10 nm to 100 $\mu$m, and said metal substrates being oppositely placed so as to be connected to said metal electrodes and sandwich said metal electrodes and said thermoelectric elements.

2. A Peltier module as claimed in claim 1, wherein said insulating thin film is formed on a surface, which is joined to said metal electrode, of surfaces of said metal substrate.

3. A Peltier module as claimed in claim 1 or 2, wherein said insulating thin film is formed on the surface of the metal substrate by high-frequency pump type ion plating.

4. A Peltier module as claimed in claim 1, wherein said metal substrate is made of any one of copper, copper alloy, aluminum, aluminum alloy, molybdenum, molybdenum alloy, tungsten, tungsten alloy, titanium, titanium alloy, nickel, nickel alloy, silver and silver alloy.

5. A Peltier module as claimed in claim 4, wherein a thickness of said metal substrate is at least 10 $\mu$m.

6. A laser module comprising:
   a laser diode (LD) element;
   a photo coupling member for coupling laser light from said LD element to an optical fiber; and
   a temperature control member for stabilizing an oscillation state of said LD element, said temperature control member including a Peltier module comprising thermoelectric elements in which plural p-type and n-type thermoelectric elements are alternately arranged, metal electrodes placed in both ends of said thermoelectric elements in order to connect said thermoelectric elements in series, and metal substrates on at least a part of which surfaces an insulating thin film comprising at least one of silica ($SiO_2$), alumina ($Al_2O_3$), aluminum nitride (AlN), and magnesia (MgO) is formed by high-frequency pump type ion plating, said insulating film having a thickness within the range of 10 nm to 100 $\mu$m, and said metal substrates being oppositely placed so as to be connected to said metal electrodes and sandwich said metal electrodes and said thermoelectric elements.

7. A laser module as claimed in claim 6, wherein said insulating thin film of the Peltier module is formed on a surface, which is joined to said metal electrode, of the surfaces of said metal substrate.

8. A laser module as claimed in claim 6 or 7, wherein said insulating thin film of the Peltier module is formed on the surface of the metal substrate by high-frequency pump type ion plating.

9. A laser module as claimed in claim 6, wherein said metal substrate of the Peltier module is made of any one of copper, copper alloy, aluminum, aluminum alloy, molybdenum, molybdenum alloy, tungsten, tungsten alloy, titanium, titanium alloy, nickel, nickel alloy, silver and silver alloy.

10. A laser module as claimed in claim 6, wherein a thickness of said metal substrate of the Peltier module is at least 10 $\mu$m.

11. A Peltier module integrated heat spreader including a Peltier module comprising thermoelectric elements in which plural p-type and n-type thermoelectric elements are alternately arranged, metal electrodes placed in both ends of the thermoelectric elements in order to connect the thermoelectric elements in series, and two metal substrates on at least a part of which surfaces an insulating thin film comprising at least one of silica ($SiO_2$), alumina ($Al_2O_3$), aluminum nitride (AlN), and magnesia (MgO) is formed by high-frequency pump type ion plating and having a thickness within the range of 10 nm to 100 $\mu$m, and the metal substrates being oppositely placed so as to be connected to the metal electrodes and sandwich the metal electrodes and the thermoelectric elements, wherein one of said two metal substrates is connected to a heat generating element and a part of the remaining metal substrate is extended to form a leg portion, said leg portion covering the heat generating element mounted on a electronic board.

12. A Peltier module integrated heat spreader as claimed in claim 4, wherein end portion of a whole circumference of said remaining metal substrate is extended to form a leg portion, said leg portion fully covering the heat generating element mounted on an electronic board.

13. A Peltier module integrated heat spreader as claimed in claim 11, wherein a part of end portion of said remaining metal substrate is extended to form a leg portion, said leg portion partially covering the heat generating element mounted on an electronic board.

14. A Peltier module integrated heat spreader as claimed in anyone of claims 11–13, wherein heat dissipating fins are further provided in the Peltier module integrated heat spreader.

* * * * *